US007538652B2

(12) United States Patent
Jenkins et al.

(10) Patent No.: US 7,538,652 B2
(45) Date of Patent: May 26, 2009

(54) ELECTRICAL COMPONENT TUNED BY CONDUCTIVE LAYER DELETION

(75) Inventors: Keith A. Jenkins, Sleepy Hollow, NY (US); Mounir Meghelli, Tarrytown, NY (US)

(73) Assignee: International Business Machines Corporation, Armonk, NY (US)

( * ) Notice: Subject to any disclaimer, the term of this patent is extended or adjusted under 35 U.S.C. 154(b) by 254 days.

(21) Appl. No.: 11/512,014

(22) Filed: Aug. 29, 2006

(65) Prior Publication Data

US 2008/0055036 A1    Mar. 6, 2008

(51) Int. Cl.
*H01F 5/00*    (2006.01)
(52) U.S. Cl. ...................................................... 336/200
(58) Field of Classification Search ................... 336/65, 336/83, 84 R, 84 C, 200, 232; 257/531
See application file for complete search history.

(56) References Cited

U.S. PATENT DOCUMENTS

| 3,947,934 | A | * | 4/1976 | Olson ......................... 29/25.42 |
| 4,021,705 | A | | 5/1977 | Lichtblau |
| 5,307,045 | A | * | 4/1994 | Senda et al. ................. 336/200 |
| 5,855,755 | A | * | 1/1999 | Murphy et al. .............. 205/122 |
| 6,005,466 | A | | 12/1999 | Pedder |
| 2004/0063039 | A1 | | 4/2004 | Liang |

FOREIGN PATENT DOCUMENTS

WO    2007058909    11/2007

OTHER PUBLICATIONS

H. Sugawara et al., "High-Q Variable Inductor Using Redistributed Layers for Si RF Circuits," 2004 Topical Meeting on Silicon Monolithic Integrated Circuits in RF Systems, IEEE, pp. 187-190, 2004.
P. Park et al., "Variable Inductance Multilayer Inductor with MOSFET Switch Control," IEEE Electron Device Letters, vol. 25, No. 3, pp. 144-146, Mar. 2004.
Y. Yokoyama et al., "On-Chip Variable Inductor Using Microelectromechanical Systems Technology," Japan Journal of Applied Physics, vol. 42, pp. 2190-2192, Apr. 2003.
H. Sugawara et al., "Variable RF Inductor on Si CMOS Chip," Japan Journal of Applied Physics, vol. 43, No. 4B, pp. 2293-2296, 2004.

* cited by examiner

*Primary Examiner*—Tuyen T. Nguyen
(74) *Attorney, Agent, or Firm*—Anne V. Dougherty; Ryan, Mason & Lewis, LLP

(57) ABSTRACT

Techniques are disclosed for fabricating tunable electrical components in integrated circuits. For example, a method of tuning a value of an electrical component, such as a planar inductor, includes the steps of placing a conductive layer in proximity of the electrical component, and adjusting an amount of material that constitutes the conductive layer such that the value of the electrical component is tuned to a particular value. The adjustment step may be performed so as to select a frequency band with which the inductor is associated or to correct a manufacturing deviation in a frequency with which the inductor is associated.

16 Claims, 2 Drawing Sheets

ELECTRICAL COMPONENT TUNED BY CONDUCTIVE LAYER DELETION

FIELD OF THE INVENTION

The present invention generally relates to integrated circuit fabrication and, more particularly, to techniques for fabricating tunable electrical components in such integrated circuits.

BACKGROUND OF THE INVENTION

Various design applications require fabrication of planar spiral inductors of a variety of specified inductance values on monolithic integrated circuits. In many such cases, the inductance may have a value which is to be determined after measurement of other components of the integrated circuit.

For example, impedance matching of the input stage of an amplifier may require an inductance different from that anticipated by the design. Another example relates to the frequency of LC-type oscillators in which the frequency of such oscillators is determined by an inductor and capacitor in parallel, namely $f=1/(2\pi\sqrt{LC})$, where f is the frequency, L is the value of the inductance and C is the value of the capacitance. Such oscillators are required, for example, in phase locked loops (PLLs).

In integrated circuits, the capacitor is typically a varactor that is a variable capacitor composed of a semiconductor device, such as a metal oxide semiconductor field effect transistor (MOSFET), where the value of capacitance is determined by a voltage applied to a terminal of the device, e.g., the gate of a MOSFET. The inductor is fixed by the designed metal geometry used to fabricate it. A varactor has a limited range of capacitance variation (tuning range), and if, due to manufacturing variation, it does not have its intended value, its tuning range may not be sufficient to permit the oscillator to operate at the designed frequency.

Similarly, the design of an integrated circuit containing a tuned oscillator may be sufficient to cover several frequency bands if the oscillator frequency could be adjusted as a final processing step. The varactor does not generally have sufficient tuning range, but if the inductor can be varied, the same circuit design can be used to fabricate circuits of various central frequencies.

H. Sugawara et al., "High-Q Variable Inductor Using Redistributed Layers for Si RF Circuits," 2004 Topical Meeting on Silicon Monolithic Integrated Circuits in RF Systems," pp. 187-190, Atlanta, 2004, discloses a technique for placement of a metal plate above a planar spiral inductor to reduce the inductance value of the planar spiral inductor. In particular, the metal plate is moved above the inductor by micromechanical action in order to attempt to obtain the desired inductance value. Such technique is illustrated in FIG. 1 wherein the planar spiral inductor is denoted by reference numeral 10, the metal plate is denoted by reference numeral 12, and the micromechanical action is denoted by reference numeral 14. The inductance of planar spiral inductor 10 is lowered as metal plate 12 overlaps a larger portion of the inductor. The change in inductance is explained by the eddy currents in the metal plate acting to oppose the magnetic flux of the inductor, and hence reducing its inductance.

In addition, P. Park et al., "Variable Inductance Multilayer Inductor with MOSFET Switch Control," IEEE Electron Device Letters, 25, pp. 144-146, 2004, and Y. Yokoyama et al., "On-Chip Variable Inductor Using Micromechanical Systems Technology," Japanese Journal of Applied Physics, 42, pp. 2190-2192, 2003, disclose other techniques for fabricating variable on-chip inductors.

However, each of these techniques relies on a complex feedback adjustment, i.e., micromechanical action in H. Sugawara et al. and Y. Yokoyama et al., and active FET control in P. Park.

SUMMARY OF THE INVENTION

Principles of the invention provide techniques for fabricating tunable electrical components in integrated circuits.

For example, in a first aspect of the invention, a method of tuning a value of an electrical component includes the steps of placing a conductive layer in proximity of the electrical component, and adjusting an amount of material that constitutes the conductive layer such that the value of the electrical component is tuned to a particular value.

Further, the placing step may further include placing the conductive layer above the electrical component. The conductive layer and the electrical component may be part of an integrated circuit. The electrical component may be an inductor such as a planar spiral inductor.

Still further, the adjusting step may be performed during a manufacturing process or a post-manufacturing process of the integrated circuit. The adjusting step may further include removing an amount of material of the conductive layer such that the value of the electrical component is tuned to a particular value. The removing step may further include performing a laser ablation operation or an etching operation to remove the amount of material.

The conductive layer may include a patterned metal level. The patterned metal level may include a plurality of concentric loops. Thus, the adjusting step may further include altering at least one of the plurality of concentric loops by forming an opening in the loop.

In a second aspect of the invention, a method of tuning an inductance value of a planar spiral inductor in an integrated circuit device includes the steps of positioning a tuning metal above the planar spiral inductor, and removing a portion of the tuning metal during manufacture of the integrated circuit device such that the inductance value of the planar spiral inductor is tuned to a particular inductance value.

In a third aspect of the invention, a method of adjusting a frequency associated with an oscillator circuit comprising at least one capacitor and at least one planar spiral inductor includes the steps of positioning a tuning metal above the planar spiral inductor, and removing a portion of the tuning metal such that the inductance value of the planar spiral inductor is tuned to a particular inductance value so as to obtain a particular frequency value for the oscillator circuit.

In a fourth aspect of the invention, an integrated circuit may include a planar spiral inductor, and a metal level positioned proximate to the planar spiral inductor, wherein the metal level is formed such that at least a portion of metal of the metal level is removable so as to affect an inductance value of the planar spiral inductor.

In a fifth aspect of the invention, a method of selecting a frequency band associated with an integrated circuit comprising at least one planar inductor includes the steps of forming a tunable planar inductor by placing a conductive layer in proximity of the planar inductor, and adjusting an amount of material that comprises the conductive layer, during a manufacturing process of the integrated circuit, such that an inductance value of the planar inductor is tuned to a particular value thereby selecting a frequency band associated with the integrated circuit.

In a sixth aspect of the invention, a method of correcting a frequency deviation associated with an integrated circuit comprising at least one planar inductor includes the steps of forming a tunable planar inductor by placing a conductive layer in proximity of the planar inductor, and adjusting an amount of material that comprises the conductive layer, during a post-manufacturing process of the integrated circuit, such that an inductance value of the planar inductor is tuned to a particular value thereby correcting a frequency deviation associated with the integrated circuit.

These and other objects, features and advantages of the present invention will become apparent from the following detailed description of illustrative embodiments thereof, which is to be read in connection with the accompanying drawings.

DETAILED DESCRIPTION OF PREFERRED EMBODIMENTS

Illustrative principles of the invention provide techniques for placement of a metal level, referred to herein as tuning metal, above a planar spiral inductor in order to lower the value of the inductance of the planar spiral inductor. It is to be understood that such tuning metal may be integrated as part of the typical wiring common to any integrated circuit.

Furthermore, while illustrative principles are described for tuning a planar spiral inductor, principles of the invention contemplate tuning electrical components other than inductors. In addition, while illustrative principles are described for placing the tuning metal above the inductor, principles of the invention contemplate placing the tuning metal in other positions or orientations proximate to the inductor. By way of example, the tuning metal can be located below the inductor so long as a mechanism is available to adjust the tuning metal in its position below the inductor. Selection of the position or orientation of the tuning metal in the proximity of the inductor is determined by how the eddy currents in the metal act to oppose the magnetic flux of the inductor. Thus, the actual pattern of the tuning metal and its proximity to the inductor are selected based on how much adjustment the actual design and/or manufacturing results require.

Still further, while the tuning layer is referred to herein as being formed from a metal (e.g., aluminum, cooper), it is to be understood that the layer can be formed from other conductive materials that support eddy currents and thus effect the inductor in a similar manner, e.g., the conductive layer may be formed from polysilicon or metal-silicide.

Figure 1:
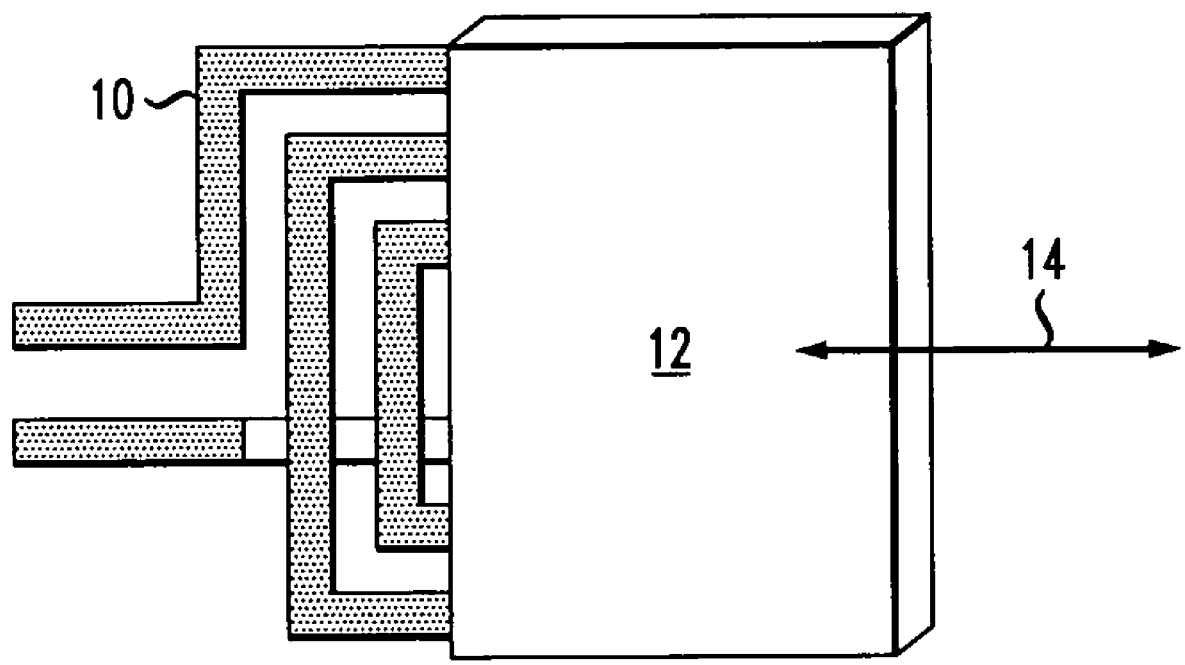
FIG. 1 illustrates a conventional technique for placement of a metal plate above a planar spiral inductor to reduce the inductance value of the planar spiral inductor.

The effect of adding a metal plate above an inductor has been shown in the above-referenced H. Sugawara et al., "High-Q Variable Inductor Using Redistributed Layers for Si RF Circuits," 2004 Topical Meeting on Silicon Monolithic Integrated Circuits in RF Systems," pp. 187-190, Atlanta, 2004. Recall FIG. 1, which illustrates the H. Sugawara et al. technique, shows how a metal plate is moved above an inductor by micromechanical action such that the inductance is lowered as the plate overlaps a larger portion of the inductor. The eddy currents in the metal plate act to oppose the magnetic flux of the inductor, thus reducing its inductance. Also, it is to be noted that if the metal of the plate is of low resistance, the Q-, or quality-factor, of the inductor is not affected very much by the presence of the plate. However, as mentioned above, one significant drawback with such. technique is that it relies on a complex feedback adjustment, i.e., micromechanical actuation.

Illustrative principles of the invention rely on the use of eddy currents to lower the inductance. However, illustrative principles of the invention advantageously employ one of several methods to reduce the amount of metal (i.e., metal deletion) which support eddy currents, to adjust the inductance to the desired target.

Figure 2A:
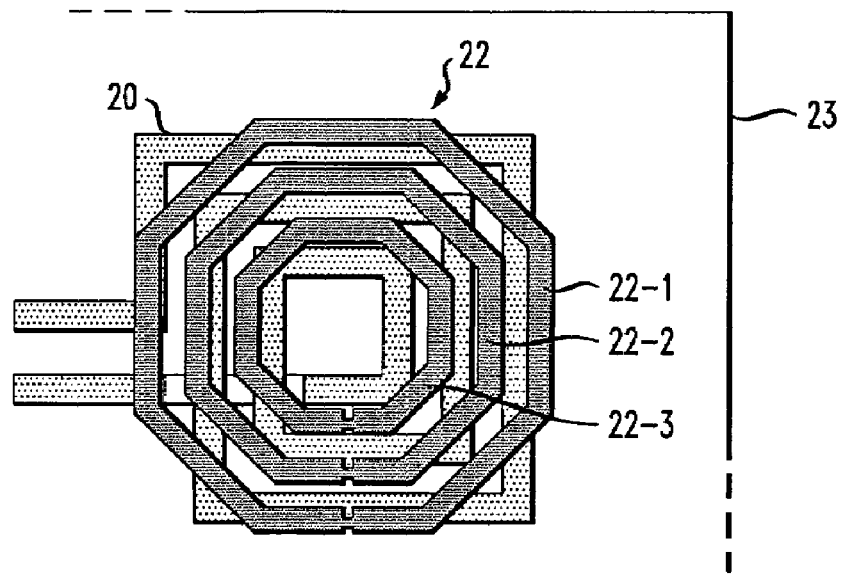
FIG. 2A illustrates a technique for placement of a patterned tuning metal above a planar spiral inductor to reduce the inductance value of the planar spiral inductor, according to an embodiment of the invention.

FIG. 2A illustrates a technique for placement of a patterned tuning metal above a planar spiral inductor to reduce the inductance value of the planar spiral inductor, according to an embodiment of the invention. More particularly, FIG. 2A depicts planar spiral inductor 20 having metal level (tuning metal) 22 positioned above it. Tuning metal 22, which forms a conductive layer (i.e., a layer that conducts eddy currents), includes a pattern formed via a plurality of concentric metal loops. In this example, tuning metal 22 includes three concentrically-positioned loops 22-1, 22-2 and 22-3. Note that in this illustrative embodiment each octagonally-shaped loop is not electrically connected to any other loop, which may be accomplished via the non-conductive material (e.g., silicon dioxide) that the loops are formed in. However, it is to be understood that other metal patterns may be used which utilize the same or similar technique. That is, in an alternative embodiment, portions of the conductive layer could be electrically connected via removable conductive tabs, as will be explained below. Accordingly, the conductive layer 22 may take any shape which supports magnetic field induced currents.

Note also that reference numeral 23 denotes an integrated circuit within which inductor 20 and tuning metal 22 (along with other electrical components not expressly shown) are formed.

In accordance with illustrative principles of the invention, a change in inductance is achieved in planar spiral inductor 20 by changing the amount of tuning metal in which eddy currents can flow. In the embodiment shown, this is accomplished by selecting the number of loops (22-1 through 22-3) that carry such eddy currents.

Figure 2B:
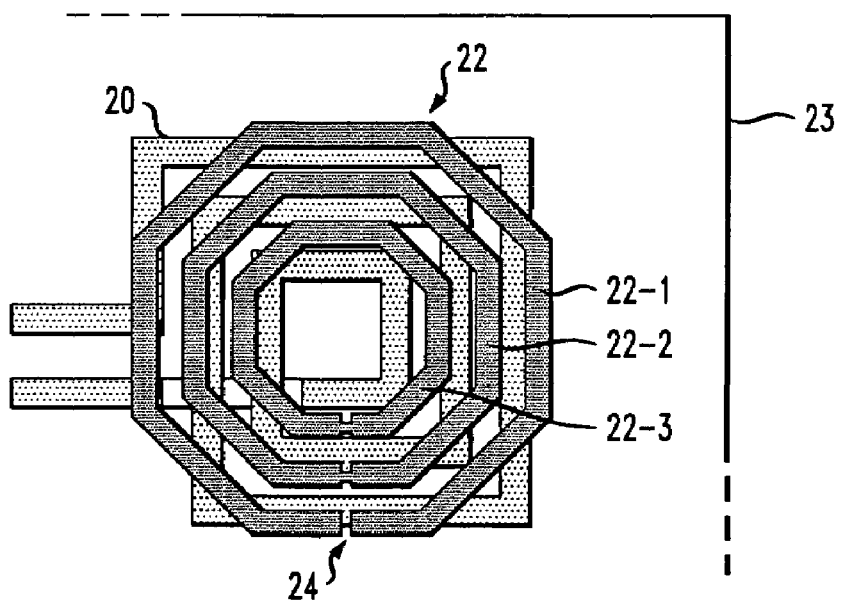
FIG. 2B illustrates a technique for adjusting the patterned tuning metal of FIG. 2A, according to an embodiment of the invention.

Using a tuned oscillator as an example, at the time of test, the oscillator frequency is measured in a conventional manner. If the frequency is above the target value, the number of loops to be removed is computed. The tuning metal is reduced to the indicated number of loops by removing a portion of the metal in part of a loop that is not to be used. This is illustrated in FIG. 2B. As shown, a metal region is removed from loop 22-1 such that an opening 24 is created. An incomplete loop (caused by the opening 24) can not contain eddy currents, and thus the effective inductance of planar spiral inductor 20 is increased by this step. The loops can be can be interrupted at test time, for example by laser ablation, or removed in a batch etching step, following application of photo-resist with customized, chip-by-chip openings.

In the case of designing a circuit for use in several frequency bands, the number of tuning metal loops may be selected by an appropriate lithography mask selection during the fabrication process.

While it is to be understood that criteria such as the size (thickness, length, etc.) and shape of the tuning metal, and height above and overlap with respect to the inductor, are dependent on the particular design application, by way of one example only, a typical planar inductor might occupy a space of 50×50 microns and the tuning metal might be placed 2 to 4 microns above the planar inductor, covering up to about 50% of the area of the planar inductor before deleting sections.

Accordingly, illustrative principles of the invention achieve a change in inductance by changing the amount of tuning metal (conductive layer) in which eddy currents can flow. This adjustment can be made during manufacturing test, and becomes permanent, eliminating complex feedback adjustments such as micromechanical actuation or active FET control. Also, the presence or absence of tuning metal will not greatly affect the Q of the inductor since the resistance of the tuning metal is low, resulting in only small resistive losses.

Furthermore, illustrative principles of the invention also allow for an adjustment of the value of the inductance of an oscillator to be adjusted, as a final custom processing step, after the initial test, to compensate for offsets of the varactor values, or to tune the oscillator to operate in one of several possible frequency bands. In this manner, a single inductor design can be used, and adjustments of the inductance needed for the particular circuit do not require new physical designs. No resistive elements, such as switchable links, which may degrade electrical characteristics are introduced in the inductor.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

What is claimed is:

1. A method of tuning a value of an electrical component, comprising the steps of:
    placing a conductive layer in proximity of the electrical component; and
    adjusting an amount of material that comprises the conductive layer such that the value of the electrical component is tuned to a particular value;
    wherein the conductive layer comprises a patterned metal level; and
    wherein the patterned metal level comprises a plurality of concentric loops.

2. The method of claim 1, wherein the placing step further comprises placing the conductive layer above the electrical component.

3. The method of claim 1, wherein the conductive layer and the electrical component are part of an integrated circuit.

4. The method of claim 3, wherein the adjusting step is performed during a manufacturing process or a post-manufacturing process of the integrated circuit.

5. The method of claim 1, wherein the adjusting step further comprises removing an amount of material of the conductive layer such that the value of the electrical component is tuned to a particular value.

6. The method of claim 5, wherein the removing step further comprises performing a laser ablation operation to remove the amount of material.

7. The method of claim 5, wherein the removing step further comprises performing an etching operation to remove the amount of material.

8. The method of claim 1, wherein the adjusting step further comprises altering at least one of the plurality of concentric loops by forming an opening in the loop.

9. The method of claim 1, wherein the electrical component is an inductor.

10. The method of claim 9, wherein the inductor is a planar spiral inductor.

11. The method of claim 1, wherein the adjustment step is performed so as to select a frequency band with which the inductor is associated.

12. The method of claim 1, wherein the adjustment step is performed to correct a manufacturing deviation in a frequency with which the inductor is associated.

13. A method of tuning an inductance value of a planar spiral inductor in an integrated circuit device, comprising the steps of:
    positioning a tuning metal above the planar spiral inductor; and
    removing a portion of the tuning metal during manufacture of the integrated circuit device such that the inductance value of the planar spiral inductor is tuned to a particular inductance value;
    wherein the tuning metal comprises a patterned metal level; and
    wherein the patterned metal level comprises a plurality of concentric loops.

14. The method of claim 13, wherein the removing step further comprises performing a laser ablation operation to remove the portion of the tuning metal.

15. The method of claim 13, wherein the removing step further comprises performing an etching operation to remove the portion of the tuning metal.

16. The method of claim 13, wherein the removing step further comprises altering at least one of the plurality of concentric loops by forming an opening in the loop.

* * * * *